(12) United States Patent
Liu et al.

(10) Patent No.: US 9,508,597 B1
(45) Date of Patent: Nov. 29, 2016

(54) 3D FIN TUNNELING FIELD EFFECT TRANSISTOR

(71) Applicant: GLOBALFOUNDRIES Inc., Grand Cayman (KY)

(72) Inventors: Zuoguang Liu, Schenectady, NY (US); Xin Sun, Menands, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/858,154

(22) Filed: Sep. 18, 2015

(51) Int. Cl.
| | | |
|---|---|---|
| H01L 21/8234 | (2006.01) | |
| H01L 29/08 | (2006.01) | |
| H01L 29/06 | (2006.01) | |
| H01L 29/49 | (2006.01) | |
| H01L 27/088 | (2006.01) | |
| H01L 29/10 | (2006.01) | |

(52) U.S. Cl.
CPC ........... *H01L 21/823431* (2013.01); *H01L 21/823425* (2013.01); *H01L 27/0886* (2013.01); *H01L 29/0611* (2013.01); *H01L 29/0865* (2013.01); *H01L 29/0882* (2013.01); *H01L 29/1033* (2013.01); *H01L 29/4916* (2013.01)

(58) Field of Classification Search
CPC ........... H01L 21/823431; H01L 21/823425; H01L 27/0886; H01L 29/66795; H01L 29/7831; H01L 29/7855; H01L 21/785
See application file for complete search history.

(56) References Cited

U.S. PATENT DOCUMENTS

| | | | |
|---|---|---|---|
| 6,642,090 B1 * | 11/2003 | Fried | H01L 21/823828 257/E21.635 |
| 7,700,466 B2 * | 4/2010 | Booth, Jr. | H01L 29/7391 257/105 |
| 8,362,561 B2 | 1/2013 | Nuttinck et al. | |
| 8,368,127 B2 | 2/2013 | Zhu et al. | |
| 8,580,667 B2 * | 11/2013 | Lui | H01L 29/407 257/E29.201 |
| 8,614,468 B2 | 12/2013 | van Dal et al. | |
| 8,617,938 B2 | 12/2013 | De Souza et al. | |
| 8,653,504 B2 | 2/2014 | Liang et al. | |
| 8,890,120 B2 | 11/2014 | Kotlyar et al. | |
| 8,975,123 B2 | 3/2015 | Daley et al. | |

(Continued)

OTHER PUBLICATIONS

Dewey, G. et al., "Fabrication, Characterization, and Physics of III-V Heterojunction Tunneling Field Effect Transistors (H-TFET) for Steep Sub-Threshold Swing," IEEE International Electron Devices Meeting (IEDM), Dec. 2011. (pp. 1-4).

(Continued)

*Primary Examiner* — Mohsen Ahmadi
(74) *Attorney, Agent, or Firm* — Hoffman Warnick LLC; Anthony Canale

(57) ABSTRACT

A method for forming a tunneling field effect transistor includes forming gate structures over a semiconductor fin on a substrate having at least two pitches between the gate structures and recessing the fin between the gate structures. A first dielectric layer is deposited over the fin to fill in a first gap between the gate structures having a smaller pitch therebetween. A second gap between the gate structures having a larger pitch is filled with a second dielectric layer. The first gap is opened by etching the first dielectric layer while the second dielectric layer protects from opening the second gap. A source region is formed on the fin in the first gap. A dielectric fills the source region in the first gaps. The second gap is opened by etching the second dielectric layer and the first dielectric layer. A drain region is formed on the fin in the second gap.

15 Claims, 15 Drawing Sheets

(56) References Cited

U.S. PATENT DOCUMENTS

| | | | |
|---|---|---|---|
| 9,202,920 B1* | 12/2015 | Liu | H01L 29/785 |
| 9,312,383 B1* | 4/2016 | Cheng | H01L 29/7827 |
| 9,362,383 B1* | 6/2016 | Balakrishnan | H01L 29/6653 |
| 9,385,023 B1* | 7/2016 | Cheng | H01L 29/7855 |
| 9,391,204 B1* | 7/2016 | Cheng | H01L 29/785 |
| 2006/0292772 A1* | 12/2006 | Anderson | H01L 21/823412 |
| | | | 438/197 |
| 2010/0015778 A1* | 1/2010 | Lin | H01L 21/76232 |
| | | | 438/443 |
| 2010/0248454 A1* | 9/2010 | Maszara | H01L 29/66795 |
| | | | 438/478 |
| 2013/0334500 A1 | 12/2013 | Smets et al. | |
| 2014/0045449 A1* | 2/2014 | Cook | H04M 1/72577 |
| | | | 455/404.1 |
| 2014/0252407 A1 | 9/2014 | Anghel et al. | |
| 2015/0028454 A1* | 1/2015 | Cheng | H01L 29/785 |
| | | | 257/616 |
| 2015/0228762 A1* | 8/2015 | He | H01L 29/66795 |
| | | | 257/410 |
| 2016/0155739 A1* | 6/2016 | Ting | H01L 27/0886 |
| | | | 257/401 |
| 2016/0187414 A1* | 6/2016 | Lin | G01R 31/2623 |
| | | | 324/719 |

OTHER PUBLICATIONS

Sarubbi, F. et al., "Chemical Vapor Deposition of a-Boron Layers on Silicon for Controlled Nanometer-Deep p+n Junction Formation," Journal of Electronic Materials, vol. 39, No. 2, Feb. 2010. (pp. 162-173).

Wirths, S. et al., "Growth of graded doped Si/SiGe Heterostructure Tunnel FET," Infoscience, May 2013. (pp. 1-2). Available at: http://infoscience.epfl.ch/record/186708.

* cited by examiner

B-B

B-B

B-B

B-B

B-B

B-B

US 9,508,597 B1

3D FIN TUNNELING FIELD EFFECT TRANSISTOR

BACKGROUND

Technical Field

The present invention relates to semiconductor devices, and more particularly to tunneling field effect transistors (TFETs) formed from fins to provide a greater effective channel width ($W_{eff}$).

Description of the Related Art

Tunneling FETs (TFETs) include an intrinsically better subthreshold slope (SS) and scaling capability than metal oxide semiconductor field effect transistors (MOSFETs). However, a primary problem of TFETs is their poor performance in drive current due to a limited effective channel width (Weff) for band-to-band tunneling. The poor performance has directed manufacturers away from using TFET technology.

SUMMARY

A method for forming a tunneling field effect transistor includes forming gate structures over a semiconductor fin on a substrate having at least two pitches between the gate structures and recessing the fin between the gate structures. A first dielectric layer is deposited over the fin to fill in a first gap between the gate structures having a smaller pitch therebetween. A second gap between the gate structures having a larger pitch is filled with a second dielectric layer. The first gap is opened by etching the first dielectric layer while the second dielectric layer protects from opening the second gap. A source region is formed on the fin in the first gap. A dielectric fills the source region in the first gaps. The second gap is opened by etching the second dielectric layer and the first dielectric layer. A drain region is formed on the fin in the second gap.

Another method for forming a tunneling field effect transistor includes forming gate structures over a semiconductor fin on a substrate having at least two pitches between the gate structures; recessing the fin between the gate structures; depositing a first dielectric layer over the fin to fill in a first gap between the gate structures having a smaller pitch therebetween by employing pinch off to fill in the first gap while the second gap remains unfilled due to its larger dimension; filling a second gap between the gate structures having a larger pitch with a second dielectric layer; opening the first gap by etching the first dielectric layer while the second dielectric layer protects from opening the second gap; forming a source region on the fin in the first gap and along exposed vertical surfaces of the fin facing into the first gap; forming a dielectric fill on the source region in the first gaps; opening the second gap by etching the second dielectric layer and the first dielectric layer; and forming a drain region on the fin in the second gap and along exposed vertical surfaces of the fin facing into the second gap wherein the source region and the drain region include opposite dopant conductivities and the source region and the drain region occupy an entire width and height of the fin to increase a width of a channel formed longitudinally along the fin.

A tunneling field effect transistor (TFET) includes gate structures formed over a semiconductor fin on a substrate having at least two pitches between the gate structures including a first gap having a smaller pitch than a second gap having a larger pitch. A source region is formed in the fin across the first gap and extending to occupy an entire width and height of a fin cross-section, and a drain region is formed in the fin across the second gap and extending to occupy an entire width and height of a fin cross-section on a side opposite the source region on a gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
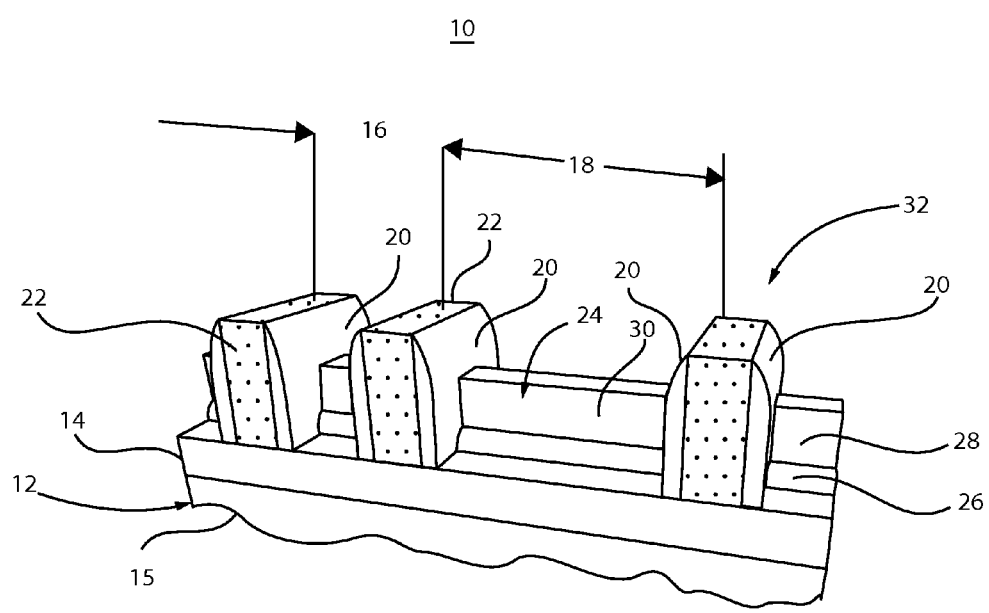
FIG. 1 is a perspective view of a partially fabricated semiconductor device showing gate structures formed on a fin at different pitches in accordance with the present principles.

In accordance with the present principles, tunneling FETs (TFETs) are provided using semiconductor fins to provide a channel. The TFETs include a three-dimensional (3D) structure, which provides better subthreshold slope (SS), scaling capability and drive current with an improved effective channel width ($W_{eff}$) for band-to-band tunneling. In one embodiment, asymmetrical source and drain regions are employed. The 3D structure of the TFET may be self-aligned without patterning source and drain regions (S/D regions) separately. This avoids a lithography step and the challenges associated with lithography including alignment problems. In addition, the 3D structures may be fabricated without S/D implantation. S/D implantation often leads to crystal damage and performance loss.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is depicted in a perspective view in accordance with one illustrative embodiment. The device 10 may include a semiconductor-on-insulator (SOI) substrate 12, although other substrates and substrate materials may be employed. The SOI substrate 12 includes a bulk substrate 15, which may include Si, Ge, SiGe, SiC, III-V materials or any other suitable material. The SOI substrate 12 includes a buried dielectric layer 14, which may include an oxide, although other dielectric materials may be employed.

A semiconductor layer formed on the buried dielectric layer 14 is patterned into fins, for example a fin 24 shown in FIG. 1. The fins then have gate structures 32 formed over the fins, e.g., fin 24. The gate structures 32 include a dummy gate 22. The dummy gate 22 may include polysilicon. In a gate-first embodiment, a gate conductor (on a gate dielectric may be formed instead of the dummy gate 22.

The gate structures 32 are spaced apart by a small gate pitch 16 and a large gate pitch 18. The large gate pitch region 18 will be for the formation of a drain region 30 on the fin 24, and the small pitch region will be for the formation of a source region 28. The gate pitches may include a ratio (large/small) of between, e.g., about 1.2 to about 2.5.

The gate structures 32 include spacers 20 formed thereon. The spacers 20 may include a nitride material. A spacer stringer 26 is formed along a base of the fin 24 (like a spacer). The spacer stringer 26 may include a nitride material.

Figure 2:
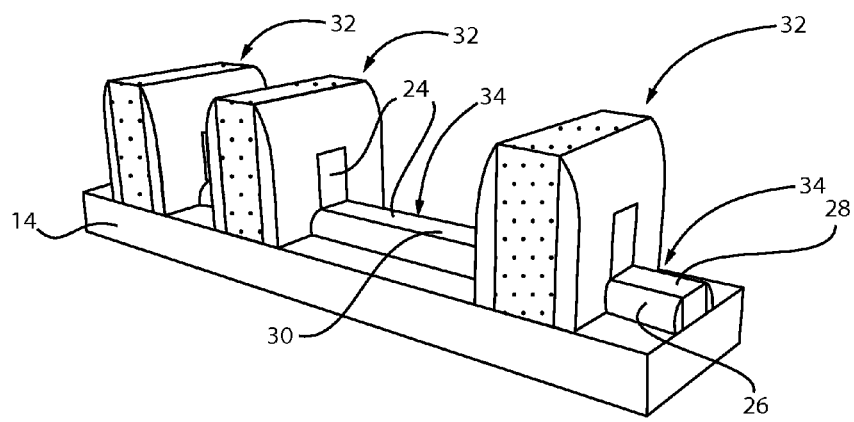
FIG. 2 is a perspective view of the partially fabricated semiconductor device of FIG. 1 showing the fin recesses between the gate structures in accordance with the present principles.

Referring to FIG. 2, the fin 24 is recessed between the gate structures 32. In one embodiment, a reactive ion etch (RIE) is performed to reduce the fin 24 selective to the dielectric materials of the gate structures 32. The etch process forms recesses 34 by reducing the source region 28 and the drain region 30 of the fin 24. This exposes an internal portion of the fin 24.

Figure 3A:
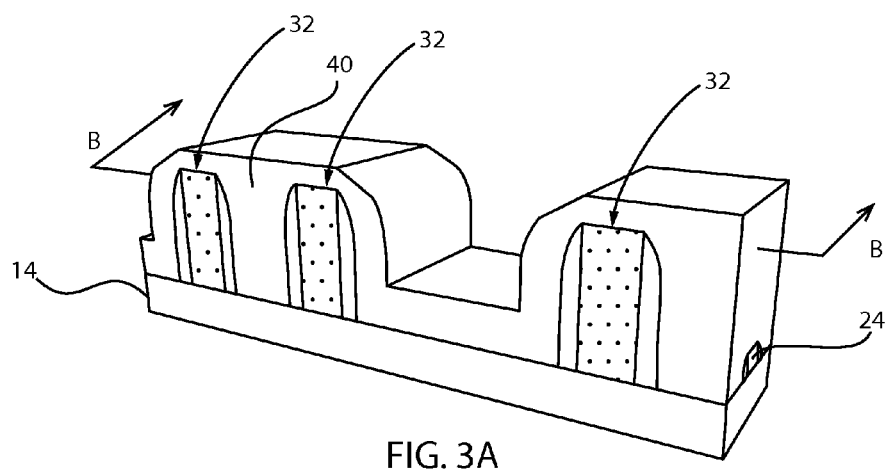
FIG. 3A is a perspective view of the partially fabricated semiconductor device of FIG. 2 showing a first dielectric deposition with pinch off between small pitch gate structures in accordance with the present principles.

Referring to FIG. 3A, a dielectric layer 40 is formed over the structure of device 10. The deposition of the dielectric layer 40 causes pinch-off in the small gap 16 between gate structures 32, but not in the large gap 18 between the gate structures 32. The dielectric layer 40 may include an oxide, e.g., a silicon oxide, although other dielectric materials may be employed.

Figure 3B:
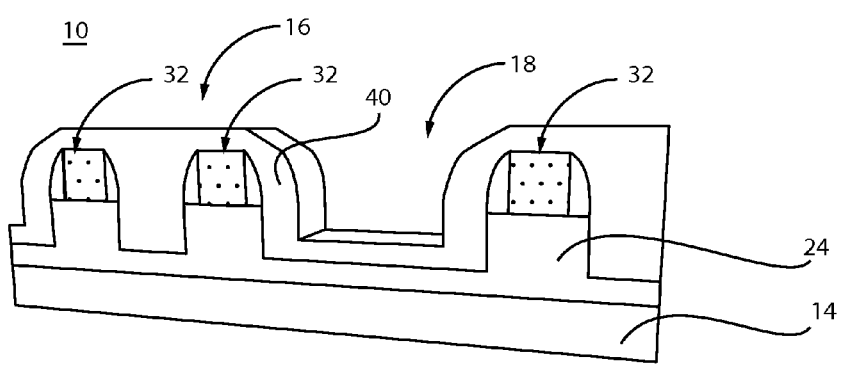
FIG. 3B is a cross-sectional view taken at section line B-B of FIG. 3A where section line B-B cuts through a center of the fin in a longitudinal direction and showing the first dielectric deposition with pinch off between the small pitch gate structures in accordance with the present principles.

Referring to FIG. 3B, a cross-sectional view taken at section line B-B of FIG. 3A is depicted. Section line B-B cuts through the fin 24 in a longitudinal direction.

Figures 4A, 4B:
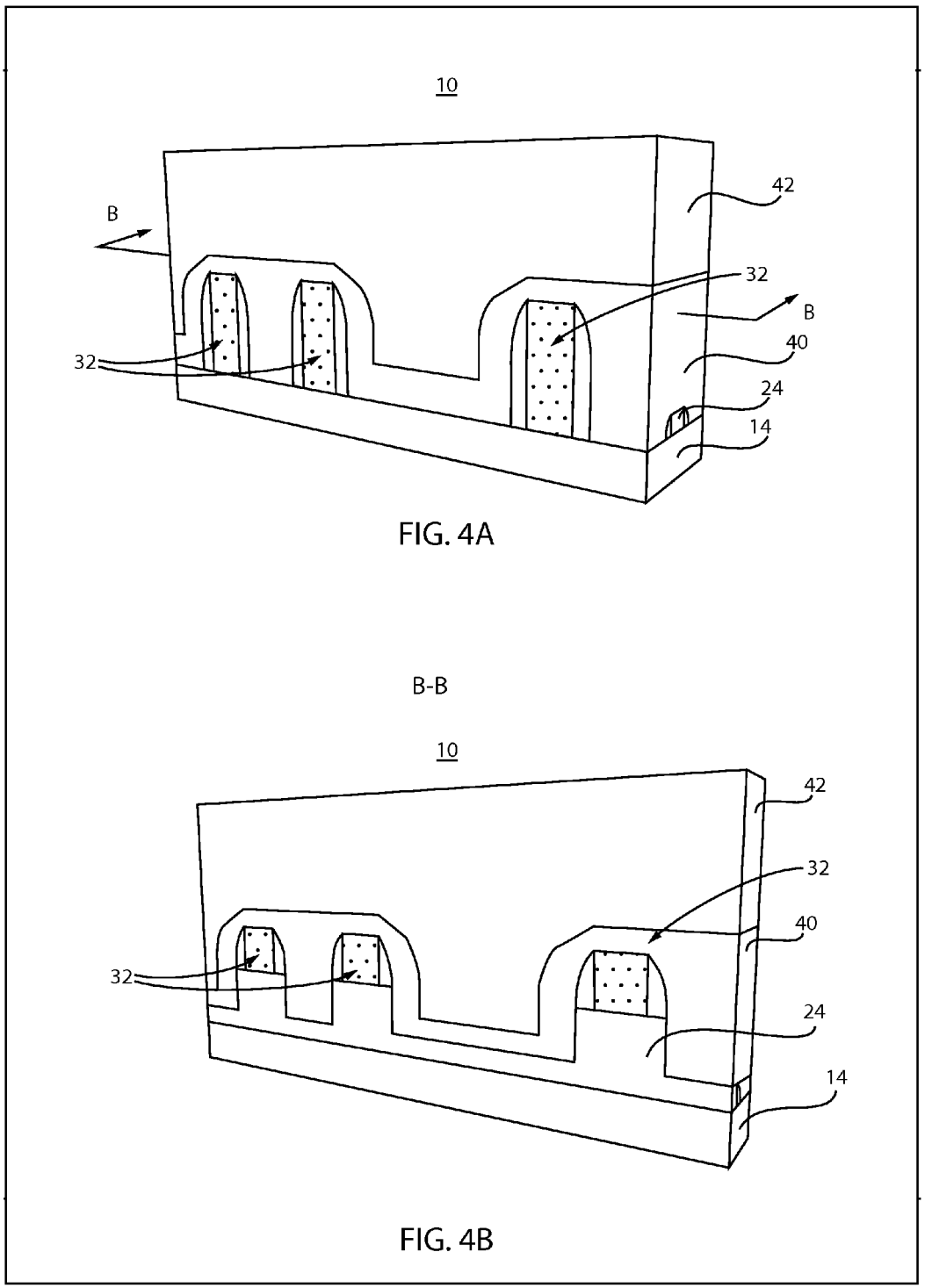
FIG. 4A is a perspective view of the partially fabricated semiconductor device of FIG. 3A showing a second dielectric deposition to fill large pitch gate structures in accordance with the present principles.
FIG. 4B is a cross-sectional view taken at section line B-B of FIG. 4A where section line B-B cuts through a center of the fin in a longitudinal direction and showing the second dielectric deposition between the large pitch gate structures in accordance with the present principles.

Referring to FIG. 4A, another dielectric layer 42 is formed over the structure of device 10. The deposition of the dielectric layer 42 fills in any remaining gaps. The dielectric layer 10 may include a nitride, e.g., a silicon nitride, although other dielectric materials may be employed. The dielectric layer 42 should be selectively etchable with respect to dielectric layer 40.

Referring to FIG. 4B, a cross-sectional view taken at section line B-B of FIG. 4A is depicted. Section line B-B cuts through the fin 24 in a longitudinal direction.

Figure 5A:
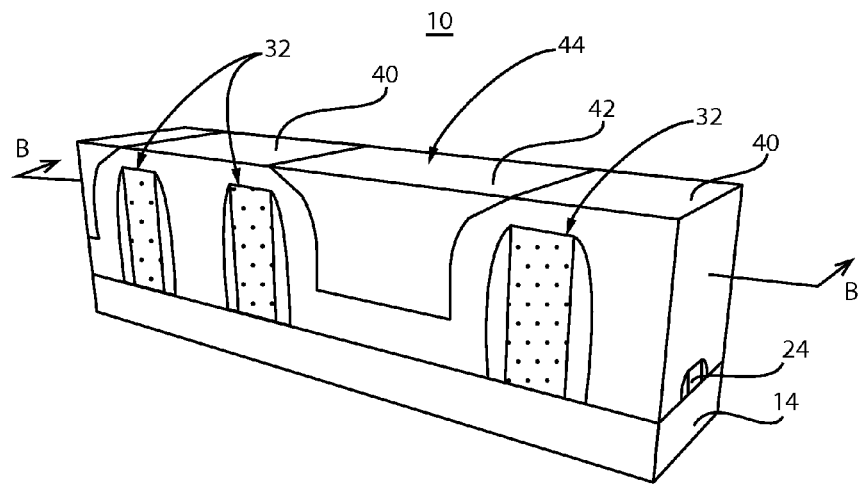
FIG. 5A is a perspective view of the partially fabricated semiconductor device of FIG. 4A showing a planarization process to planarize the second dielectric down to the first dielectric in accordance with the present principles.

Referring to FIG. 5A, the dielectric layer 42 is planarized to form a planar top surface 44. The planarization may include a chemical mechanical polish (CMP), although other planarizing processes may be employed. The planarization process stops on the dielectric layer 40 and a slight overpolish may be acceptable.

Figure 5B:
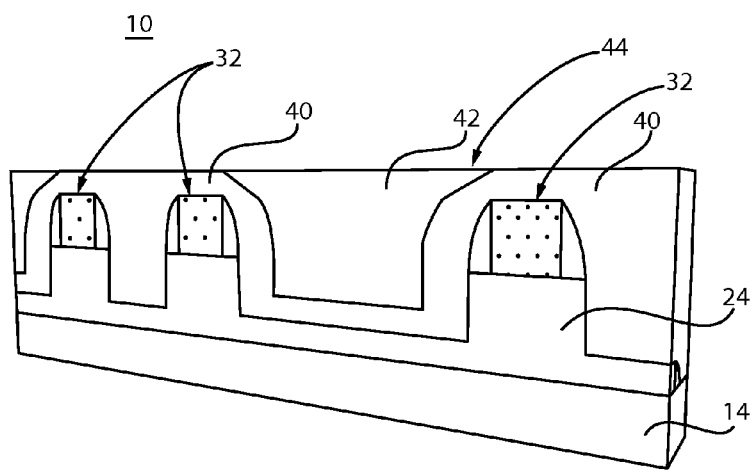
FIG. 5B is a cross-sectional view taken at section line B-B of FIG. 5A where section line B-B cuts through a center of the fin in a longitudinal direction and showing the second dielectric planarized in accordance with the present principles.

Referring to FIG. 5B, a cross-sectional view taken at section line B-B of FIG. 5A is depicted. Section line B-B cuts through the fin 24 in a longitudinal direction.

Figure 6A:
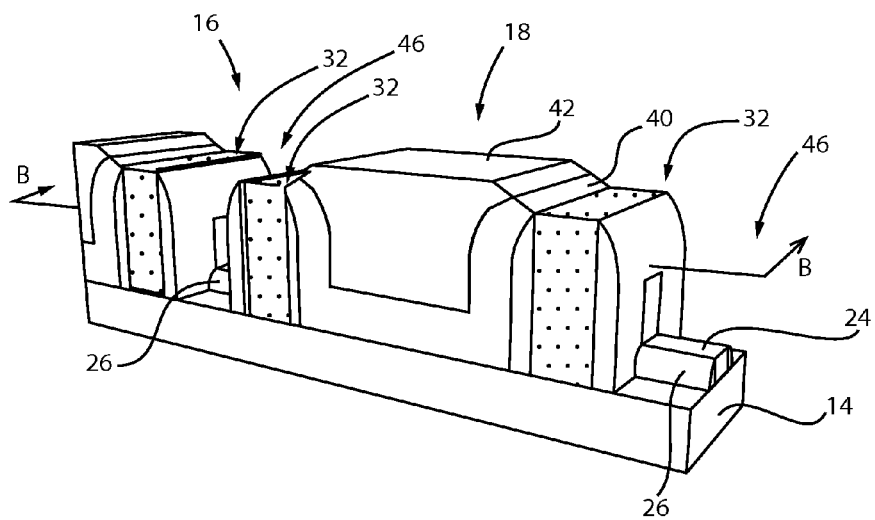
FIG. 6A is a perspective view of the partially fabricated semiconductor device of FIG. 5A showing the removal of the first dielectric between gate structures to expose the fin in accordance with the present principles.

Referring to FIG. 6A, the dielectric layer 40 is removed between gate structures 32 in the small pitch gap 16 by a wet etch process. The wet etch process is performed over the device 10 to remove the pinched off and exposed dielectric 40, but the dielectric layer 40 in the large gap 18 between gate structures 32 is protected by dielectric layer 42. The wet etch process may include an HF etch or equivalent. The wet etch process exposes the fin 24 in regions 46 between the gate structures 32.

Figure 6B:
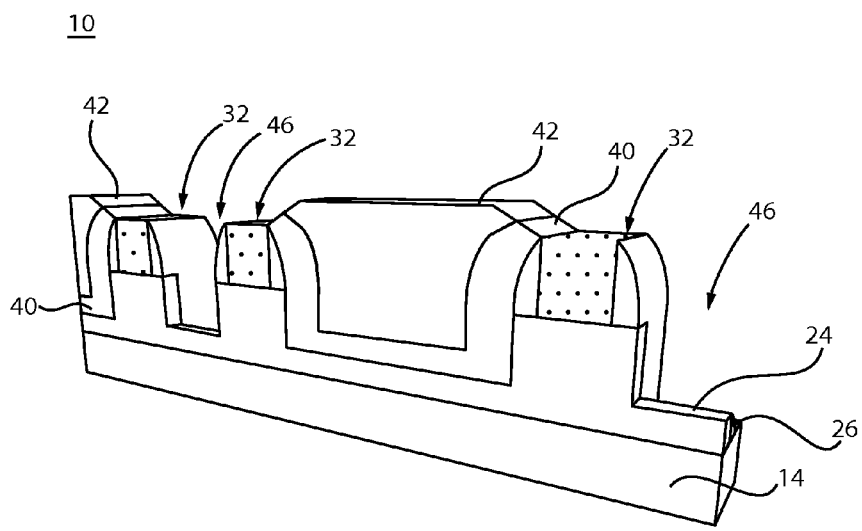
FIG. 6B is a cross-sectional view taken at section line B-B of FIG. 6A where section line B-B cuts through a center of the fin in a longitudinal direction and showing the removal of the first dielectric between gate structures in accordance with the present principles.

Referring to FIG. 6B, a cross-sectional view taken at section line B-B of FIG. 6A is depicted. Section line B-B cuts through the fin 24 in a longitudinal direction.

Figures 7A, 7B:
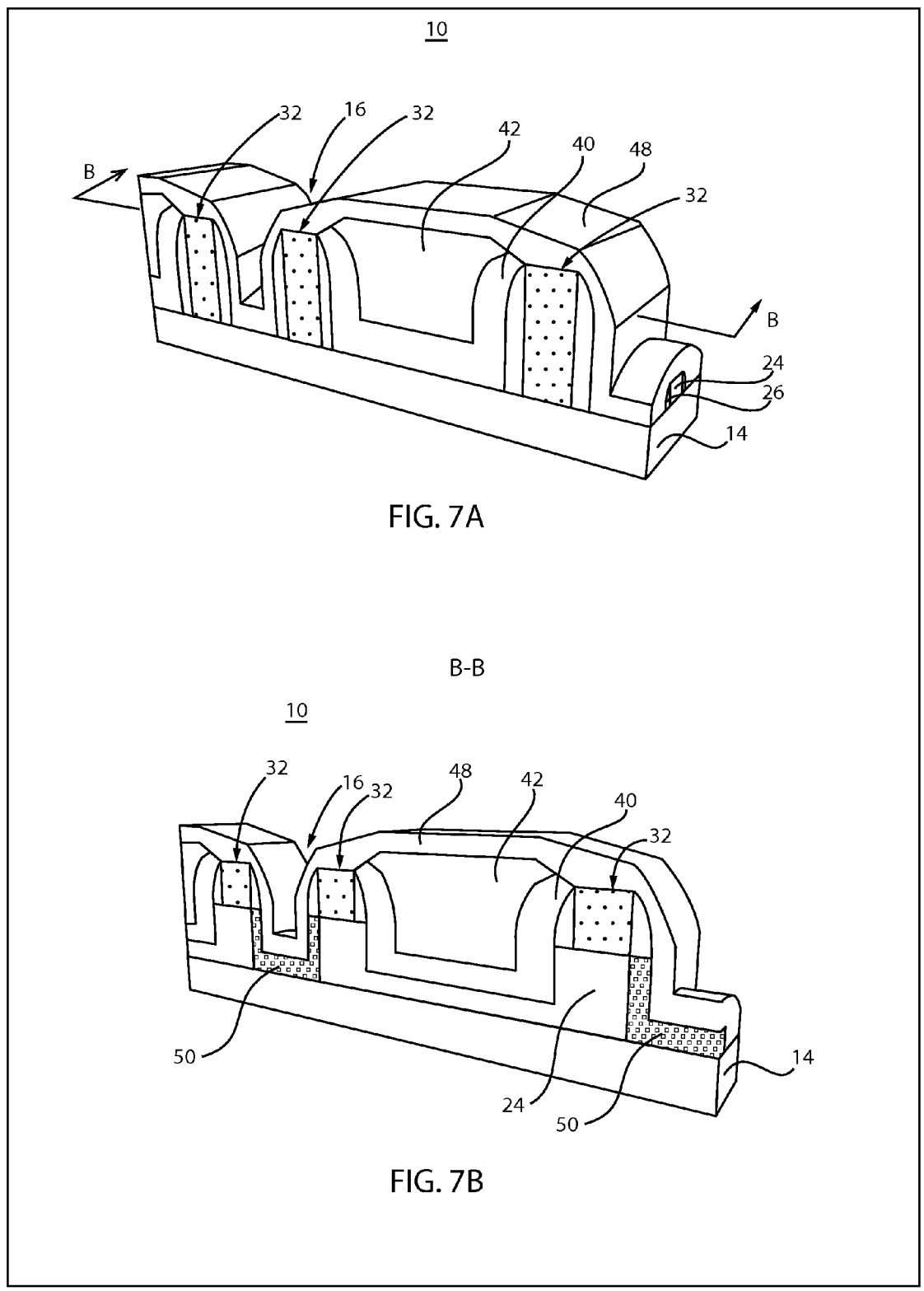
FIG. 7A is a perspective view of the partially fabricated semiconductor device of FIG. 6A showing a deposition of a dopant donor layer to form a source region on the fin in accordance with the present principles.
FIG. 7B is a cross-sectional view taken at section line B-B of FIG. 7A where section line B-B cuts through a center of the fin in a longitudinal direction and showing the deposition of the dopant donor layer to form the source region on the fin in accordance with the present principles.

Referring to FIG. 7A, a dopant donor layer 48 is deposited conformally over the device 10. The donor layer 48 may include boron or other dopants. In one embodiment, donor layer 48 includes $B_2H_6$.

Referring to FIG. 7B, a cross-sectional view taken at section line B-B of FIG. 7A is depicted. Section line B-B cuts through the fin 24 in a longitudinal direction. The donor layer 48 makes contact with the fin 24 in the small gap 16. After deposition of the donor layer 48, a drive-in process is performed to cause dopants from the donor layer 48 to diffuse into the fin 24 to form source regions 50. The drive-in process includes an anneal process to drive the dopants into the fin 24 where contact is made between the fin 24 and the donor layer 48. In one embodiment, the source regions 50 include SiB ($SiB_x$). In another embodiment, instead of depositing a donor layer 48 and performing a drive-in process, a doped epitaxial layer (not shown) may be selectively grown on exposed areas of the fin 24 (in the small gap 16). The doped epitaxial layer may include, e.g., B-doped SiGe. The selectively grown doped epitaxial layer would then be annealed to drive in dopants to form the source region 50. The epitaxial layer may then be removed.

The source region 50 is advantageously self-aligned on the fin 24 using the gate structures 32 to delineate the source region 50. The source region 50 is formed without lithographic patterning and without employing ion implantation to dope the source region 50.

Figure 8A:
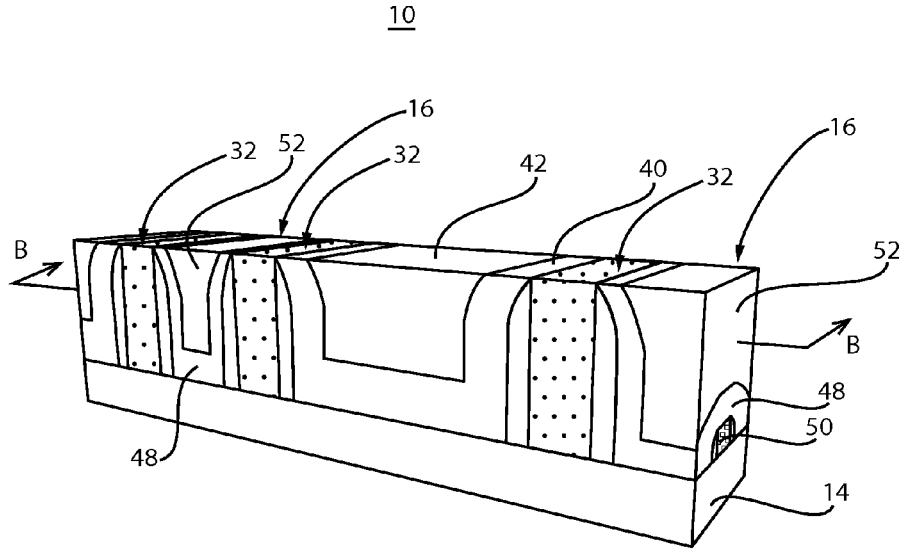
FIG. 8A is a perspective view of the partially fabricated semiconductor device of FIG. 7A showing a deposition and planarization of an organic dielectric layer (ODL) in accordance with the present principles.

Referring to FIG. 8A, an organic dielectric layer (ODL) 52 is deposited over the device 10 and planarized to fill the small gaps 16. The planarization of the ODL 52 may include CMP, although other planarizing processes may be employed. The planarization process stops on the dielectric layer 42.

Figure 8B:
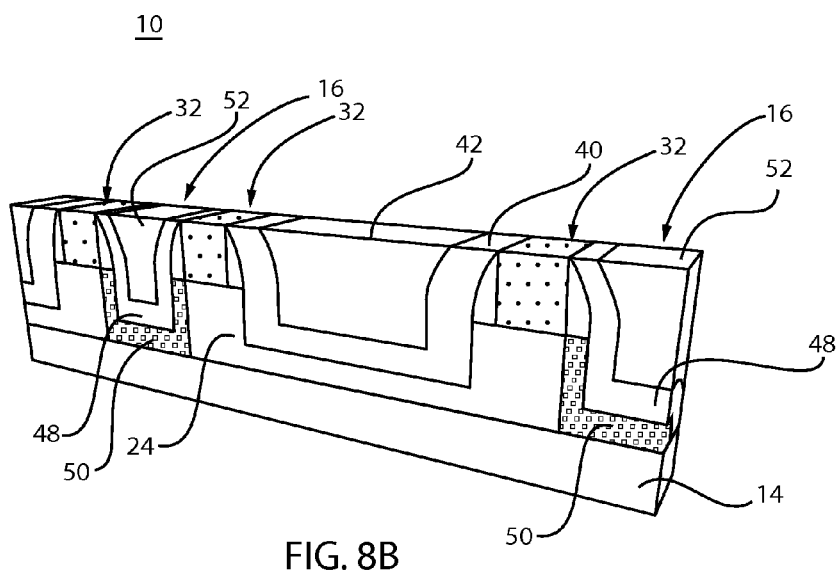
FIG. 8B is a cross-sectional view taken at section line B-B of FIG. 8A where section line B-B cuts through a center of the fin in a longitudinal direction and showing the deposition and planarization of the ODL in accordance with the present principles.

Referring to FIG. 8B, a cross-sectional view taken at section line B-B of FIG. 8A is depicted. Section line B-B cuts through the fin 24 in a longitudinal direction.

Figure 9A:
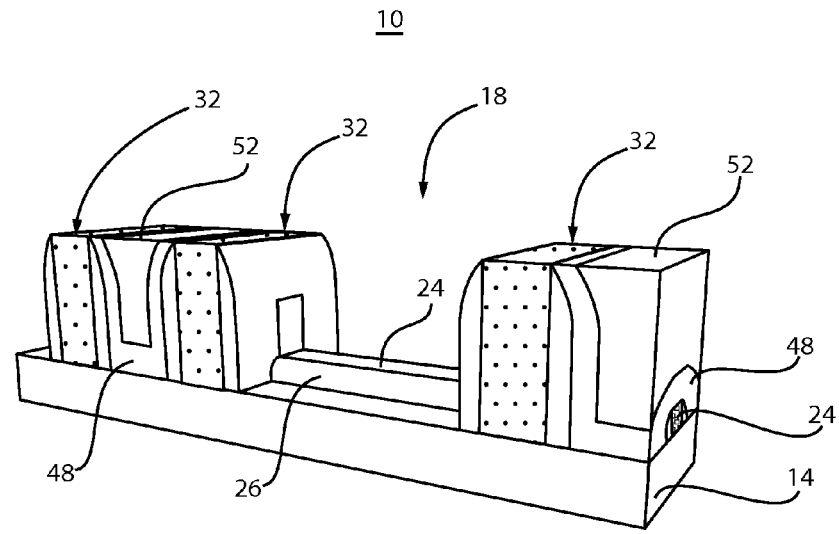
FIG. 9A is a perspective view of the partially fabricated semiconductor device of FIG. 8A showing the fin exposed in the large pitch gap between gate structures in accordance with the present principles.

Referring to FIG. 9A, dielectric layer 42 and dielectric layer 40 are removed from the large gap 18 to expose the fin 24. The dielectric layer 42 is removed selectively to the ODL 52 and materials of the gate structures 32. This is followed by the dielectric layer 40 being removed selectively to the ODL 52 and materials of the gate structures 32. The dielectric layer 42 may be removed by a wet or dry etch. Dielectric layer 40 may be removed by a wet etch, e.g., HF. This exposes the fin 24 in the large gap 18 in preparation of the formation of drain regions.

Figure 9B:
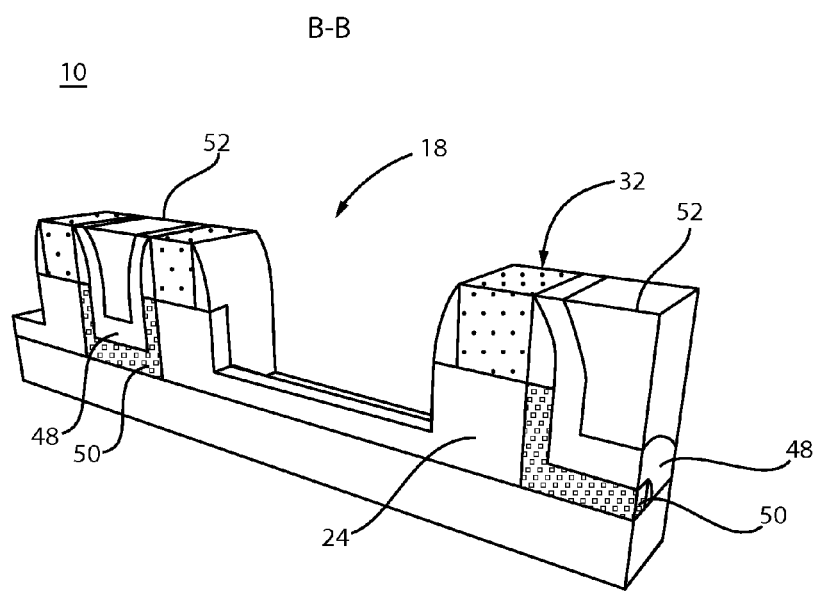
FIG. 9B is a cross-sectional view taken at section line B-B of FIG. 9A where section line B-B cuts through a center of the fin in a longitudinal direction and showing the fin exposed in the large pitch gap between gate structures in accordance with the present principles.

Referring to FIG. 9B, a cross-sectional view taken at section line B-B of FIG. 9A is depicted. Section line B-B cuts through the fin 24 in a longitudinal direction.

Figure 10A:
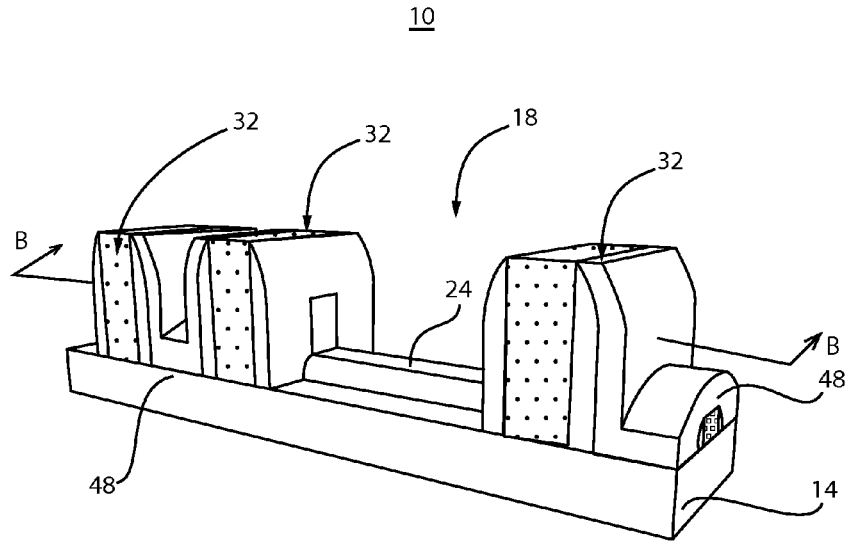
FIG. 10A is a perspective view of the partially fabricated semiconductor device of FIG. 9A showing the ODL removed and the dopant donor layer oxidized in accordance with the present principles.

Referring to FIG. 10A, an optional ODL strip is performed to remove ODL 52 from the small gap 16. An anneal process is performed to oxidize the donor layer 48 to form a dielectric layer. An oxide clean process is then performed to clean the exposed fin 24 in preparation of the formation of a drain region. The clean process may include a diluted HF etch (DHF).

Figure 10B:
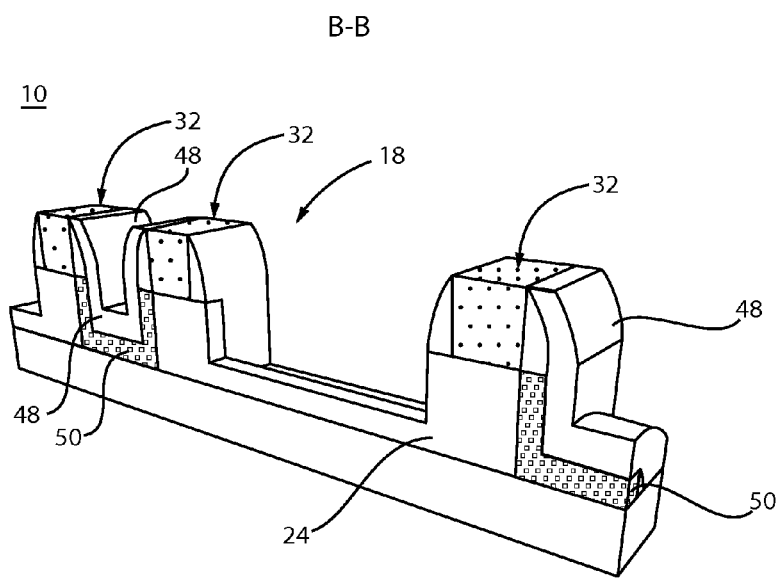
FIG. 10B is a cross-sectional view taken at section line B-B of FIG. 10A where section line B-B cuts through a center of the fin in a longitudinal direction and showing the ODL removed and the dopant donor layer oxidized in accordance with the present principles.

Referring to FIG. 10B, a cross-sectional view taken at section line B-B of FIG. 10A is depicted. Section line B-B cuts through the fin 24 in a longitudinal direction.

Figure 11A:
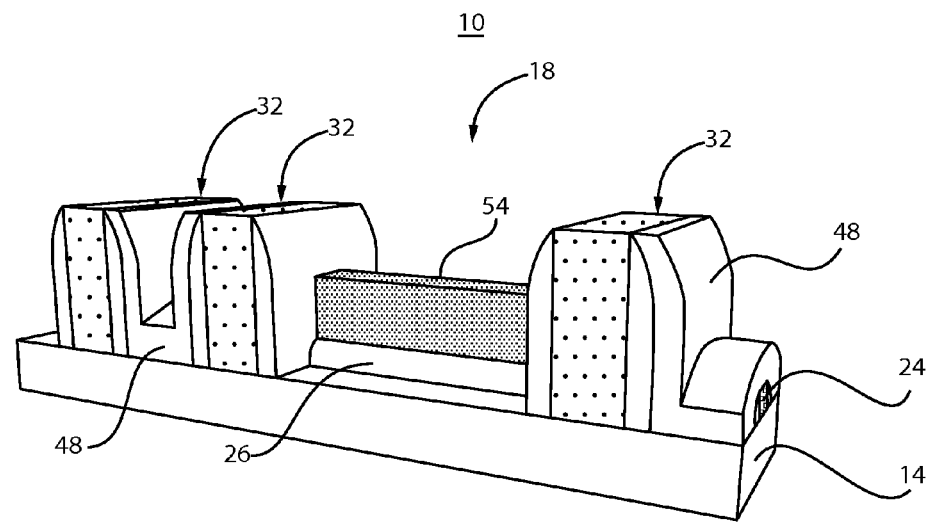
FIG. 11A is a perspective view of the partially fabricated semiconductor device of FIG. 10A showing an epitaxial layer grown on the exposed fin in the large gap to form a drain region in accordance with the present principles.

Referring to FIG. 11A, a drain region 56 is formed. The drain region 56 may be formed using an epitaxially grown layer 54 on the exposed fin 24 in the large gap 18. The epitaxially grown layer 54 includes a dopant that is driven into the fin 24 during a drive-in process (anneal). The epitaxially grown layer 54 may include, e.g., SiP to drive in P dopants. In one embodiment, the drain region 56 includes $SiP_x$. Other dopants may be employed. Note that the source region 50 and the drain region 56 include dopants of opposite conductivity as a feature of a TFET in accordance with the present principles.

In another embodiment, the drain region 56 may be formed similarly to the source regions 50. In this embodiment, a dopant donor layer (not shown) may be deposited (e.g., $PH_3$, $AsH_3$, etc.) over the device 10 and a drive-in process is performed to dope the fin 24 to form drain region 56.

The drain region 56 is advantageously self-aligned on the fin 24 using the gate structures 32 to delineate the drain region 56. The drain region 56 is formed without lithographic patterning and without employing ion implantation to dope the drain region 56.

Figure 11B:
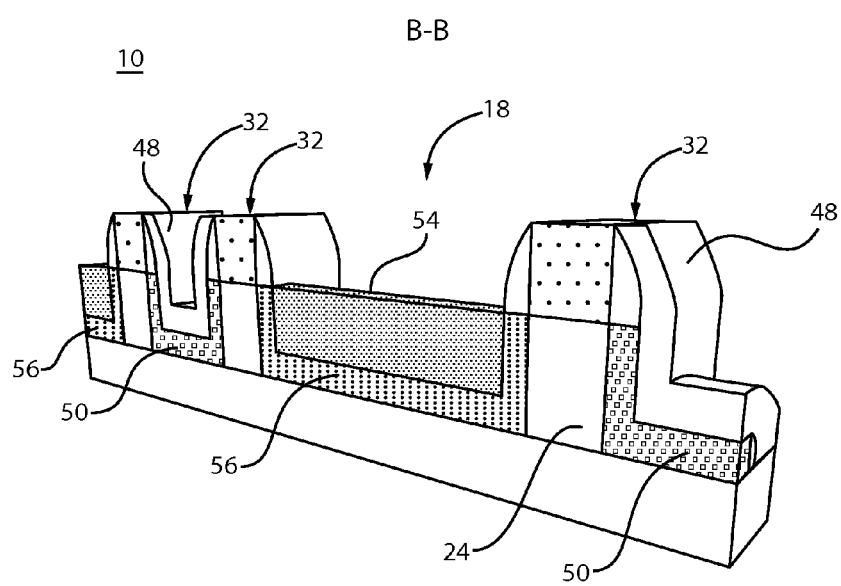
FIG. 11B is a cross-sectional view taken at section line B-B of FIG. 11A where section line B-B cuts through a center of the fin in a longitudinal direction and showing the epitaxial layer grown on the exposed fin in the large gap to form the drain region in accordance with the present principles.

Referring to FIG. 11B, a cross-sectional view taken at section line B-B of FIG. 11A is depicted. Section line B-B cuts through the fin 24 in a longitudinal direction.

Figure 12A:
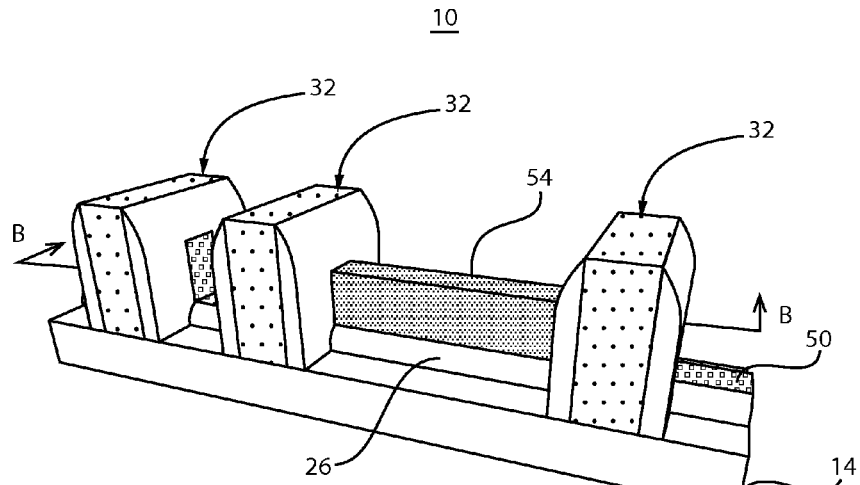
FIG. 12A is a perspective view of the partially fabricated semiconductor device of FIG. 11A showing the dopant donor layer removed in accordance with the present principles.

Referring to FIG. 12A, the oxidized donor layer 48 is stripped from the device 10. The stripping process may include a boiling $HNO_3$ etch (e.g., 65%) or an Aqua Regia to strip out, e.g., oxidized $B_2H_6$.

Figure 12B:
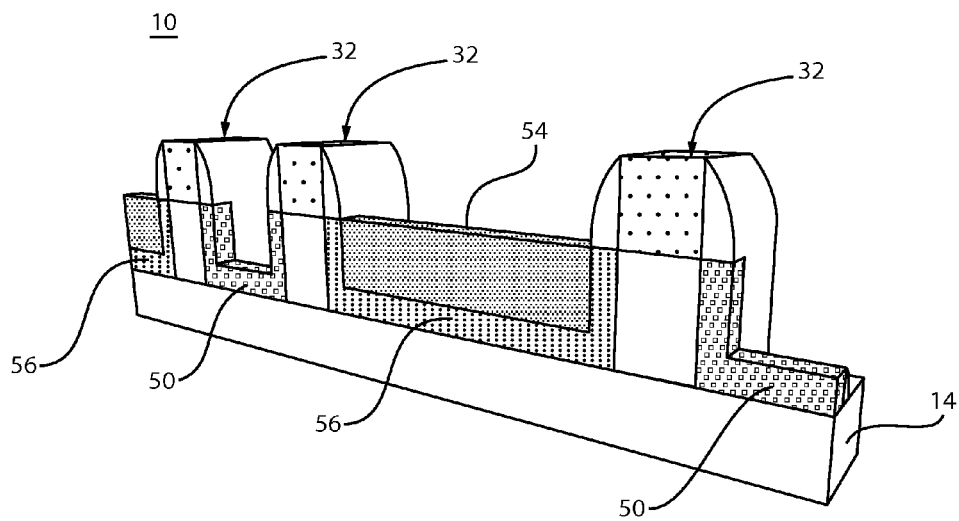
FIG. 12B is a cross-sectional view taken at section line B-B of FIG. 12A where section line B-B cuts through a center of the fin in a longitudinal direction and showing the dopant donor layer removed in accordance with the present principles.

Referring to FIG. 12B, a cross-sectional view taken at section line B-B of FIG. 12A is depicted. Section line B-B cuts through the fin 24 in a longitudinal direction. The fin sections (24) under the gate structures 32 provide a large effective channel width for tunneling charge. The source regions 50 and the drain regions 56 extend over the entire cross-section of the fins 24 and provide a high drive current over conventional planar devices due at least to the large effective channel width. The three-dimensional TFET is also isolated from the bulk substrate (15).

Figure 13A:
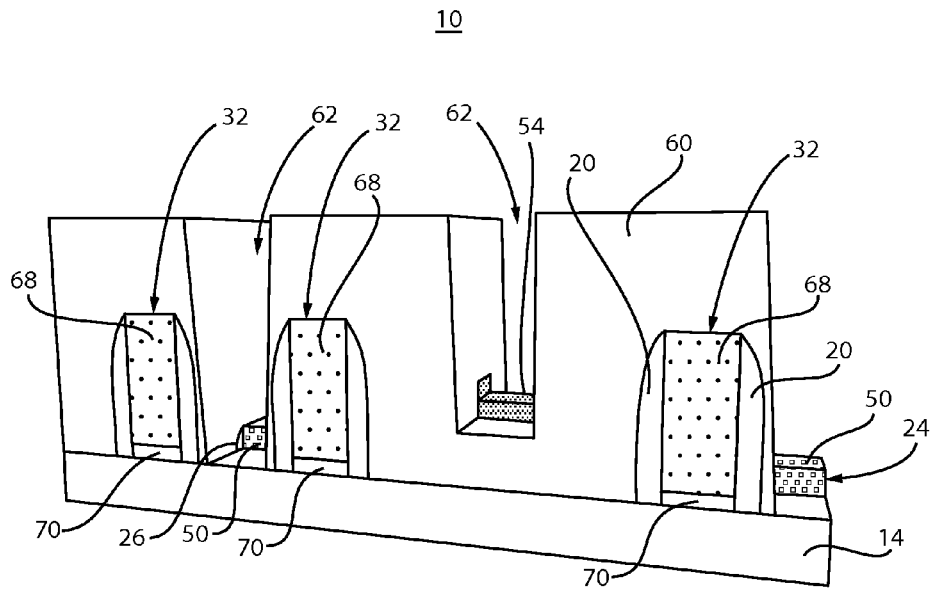
FIG. 13A is a perspective view of the partially fabricated semiconductor device of FIG. 12A showing an interlevel dielectric (ILD) formed and patterned for contacts in accordance with the present principles.

Referring to FIG. 13A, a replacement metal gate process is performed to remove the dielectric material 22 (e.g., polysilicon and hard mask) between spacers 20 by an etch process, e.g., RIE. Then, a gate dielectric 70 is formed in contact with the fin 24. The gate dielectric 70 may include high-k dielectric materials, e.g., $HfO_2$ or the like. Then, a gate conductor 68 is formed on the gate dielectric 70 between the spacers 20. The gate conductor 68 may include a metal, such as W, Cu, Al, etc.

A flowable dielectric layer 60 is then deposited over the device 10. The flowable dielectric layer 60 may include an oxide material. A lithography process is employed to define an etch mask for etching contact openings 62. The contact openings 62 are etched down to the source region 50 and the epitaxially grown layer 54. The etch process may form a recess notch 64 in the epitaxially grown layer 54. This increases contact area for the later formed contacts.

Figure 13B:
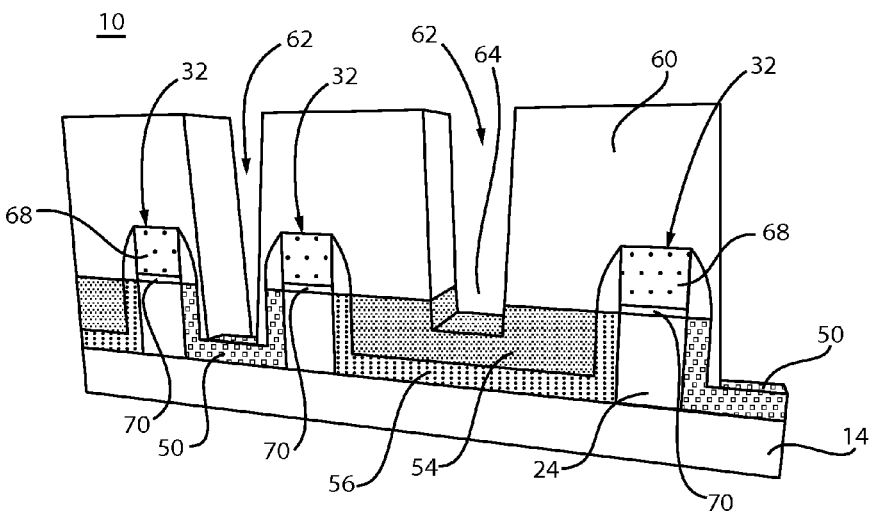
FIG. 13B is a cross-sectional view taken at section line B-B of FIG. 13A where section line B-B cuts through a center of the fin in a longitudinal direction and showing the ILD patterned in accordance with the present principles.

Referring to FIG. 13B, a cross-sectional view taken at section line B-B of FIG. 13A is depicted. Section line B-B cuts through the fin 24 in a longitudinal direction. The epitaxially grown layer 54 is etched further to form the recess notch 64 to increase contact area and therefore reduce contact resistance to the drain region 54/56 by a contact.

Figure 14:
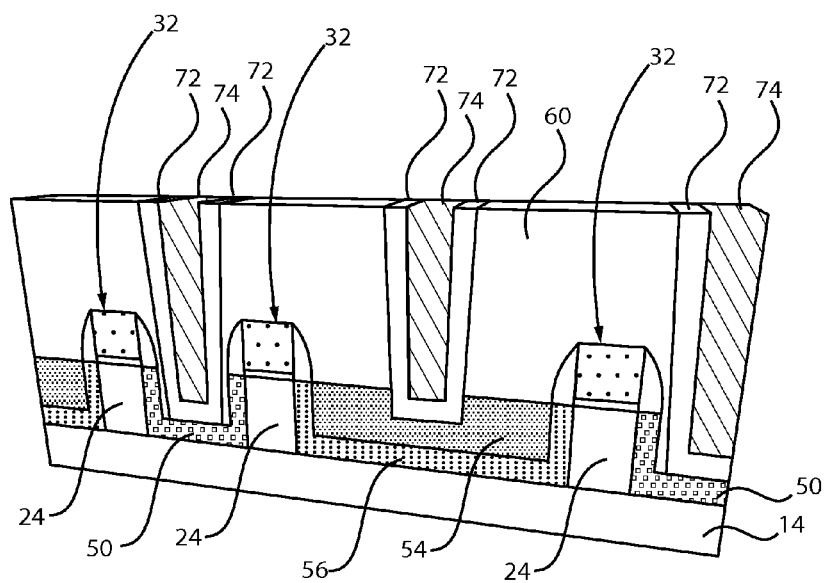
FIG. 14 is a cross-sectional view of the partially fabricated semiconductor device of FIG. 13B showing source and drain contacts formed in accordance with the present principles.

Referring to FIG. 14, a cross-sectional view taken at a same position as section line B-B of FIG. 13A is depicted. Section line B-B cuts through the fin 24 in a longitudinal direction. A liner 72 is formed in the contact openings 62. This is followed by a conductive material deposition process to form contacts 74. The liner 72 may include Ti, TiN, TaN, NiPt, Ni, etc. The conductive material deposition may include W, Al, Cu or other metals. A CMP or other planarizing process is performed to remove the liner 72 and conductive material for contacts 74 from a top surface.

Figure 15:
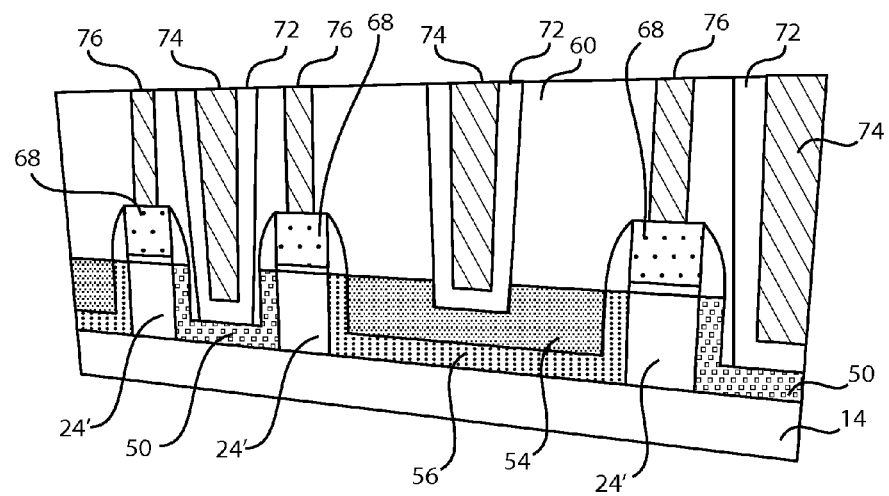
FIG. 15 is a cross-sectional view of the partially fabricated semiconductor device of FIG. 14 showing gate contacts formed in accordance with the present principles.

Referring to FIG. 15, a cross-sectional view taken at a same position as section line B-B of FIG. 13A is depicted. Section line B-B cuts through the fin 24 in a longitudinal direction. Gate contact openings are etched though the flowable dielectric layer 60 and gate contacts 76 are formed. The gate contacts 76 land on the gate conductor 68. The gate contacts 76 may include W, Al, Cu or similar metals. A CMP or other planarizing process is performed to remove the material for gate contacts 76 from a top surface.

The source region 50 and the drain region 56 are formed across the entire width and the entire height of fin channel sections 24'. This optimizes the effective channel width and permits the TFET device 10 to overcome performance issues encountered by conventional devices.

Figure 16:
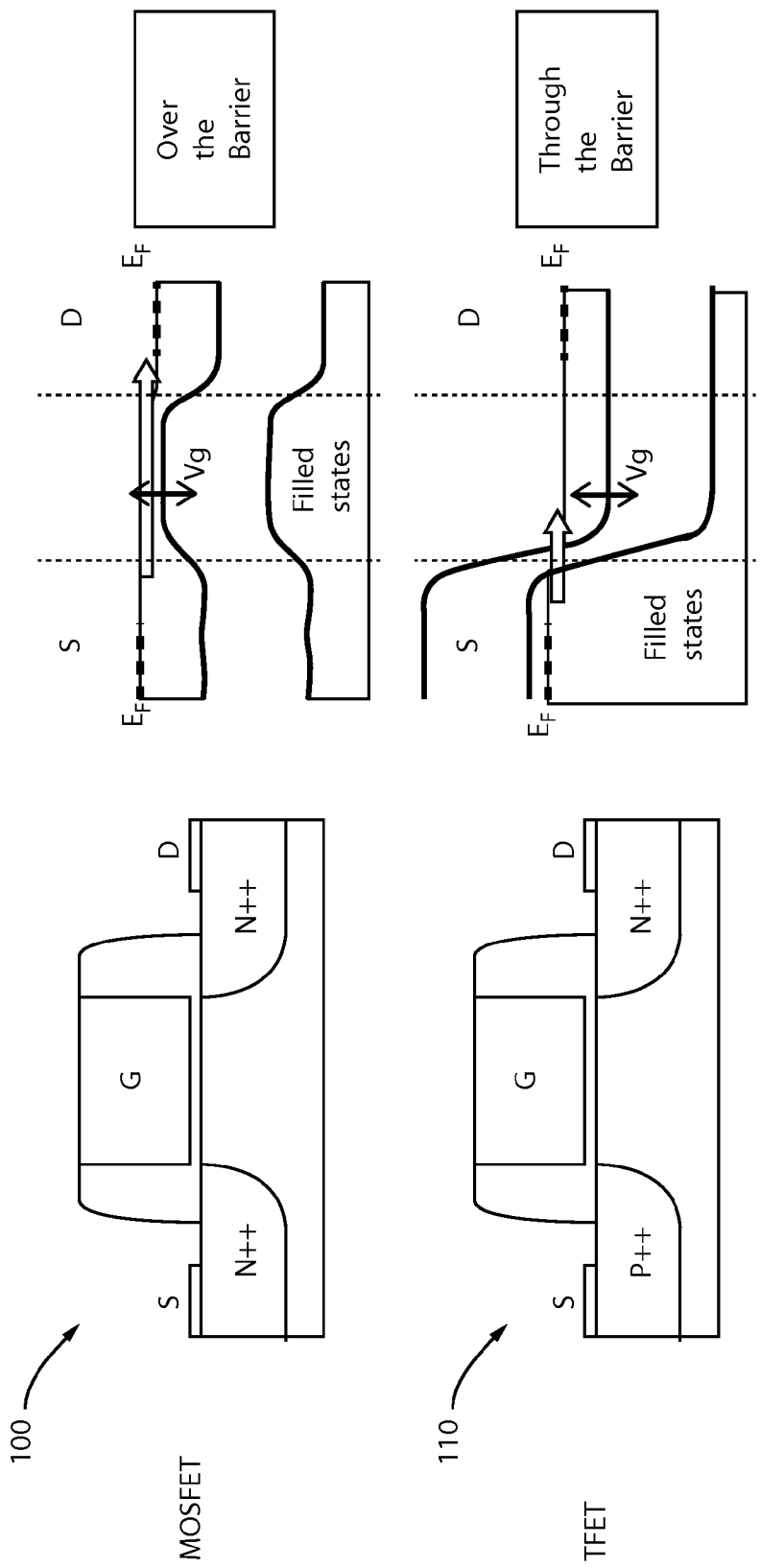
FIG. 16 is a diagram showing a comparison between structures and conduction bands between metal oxide semiconductor field effect transistors (MOSFETs) and tunneling field effect transistors (TFETs) in accordance with illustrative embodiments.

Referring to FIG. 16, a comparison of a metal oxide semiconductor field effect transistor (MOSFET) 100 versus a tunneling field effect transistor (TFET) 102 is shown. The MOSFET 100 includes a same doping conductivity (N++) for source (S) and drain (D) regions. The TFET 110 includes different doping conductivity for source (S) (P++) and drain (D) (N++) regions. The MOSFET 100 conducts over an energy barrier (Fermi energy ($E_F$)) when a gate voltage (Vg) is applied to a gate (G). The TFET 110 conducts or tunnels through an energy barrier when the gate voltage (Vg) is applied to the gate (G).

Figure 17:
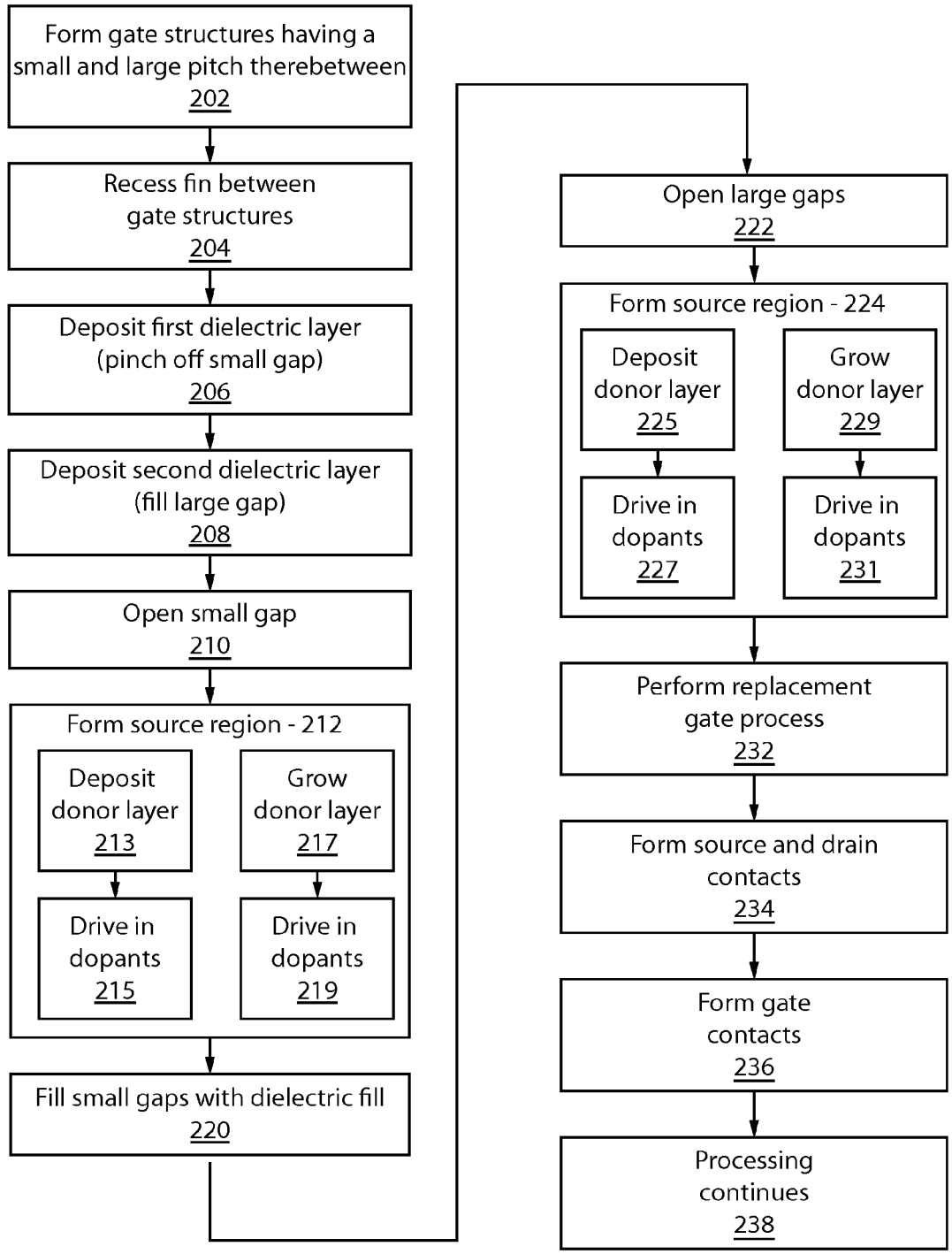
FIG. 17 is a block/flow diagram showing methods for forming a TFET in accordance with illustrative embodiments.

Referring to FIG. 17, methods for forming a tunneling field effect transistor are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, gate structures are formed over a semiconductor fin on a substrate having at least two pitches between the gate structures. The gate structures may include dummy gate structures although the gate structures may include active gate structures in a gate first process. In block 204, the fin is recessed between the gate structures. The recess exposes vertical surfaces of the fin. Recessing the fin between the gate structures enables the source region and the drain region to be formed to occupy an entire width and height of the fin to increase a width of a channel formed longitudinally along the fin.

In block 206, a first dielectric layer is deposited over the fin to fill in a first gap between the gate structures having a smaller pitch therebetween. In one embodiment, the first dielectric layer fills in the first gap by employing pinch off during the depositing to fill in the first gap while the second gap remains unfilled due to its larger dimension.

In block 208, a second gap between the gate structures having a larger pitch is filled with a second dielectric layer. In block 210, the first gap is opened by etching the first dielectric layer while the second dielectric layer protects from opening the second gap.

In block 212, a source region is formed on the fin in the first gap. In block 213, a dopant donor layer is deposited. In block 215, dopants are driven into the fin with an anneal process. The donor dopant layer is oxidized and stripped off later in the process before forming the drain region. In an alternate embodiment, the source region is formed by epitaxially growing a dopant donor layer selectively on the fin in the first gap in block 217. In block 219, dopants are driven into the fin with an anneal process. The dopant donor layer may be removed.

In block 220, a dielectric fill is provided on the source region in the first gaps. The dielectric fill may include an ODL and has a selectivity to permit removal of oxide and nitrides with respect to the ODL. In block 222, the second gap is opened by etching the second dielectric layer and the first dielectric layer.

In block 224, a drain region is formed on the fin in the second gap. In block 225, the drain region formation on the fin in the second gap may include depositing a dopant donor layer. In block 227, dopants are driven in with an anneal process.

In an alternate embodiment, the drain may be formed by epitaxially growing a dopant donor layer selectively on the fin in the second gap in block 229. In block 231, dopants are driven in with an anneal process. The dopant donor layer may remain as part of the drain region in any embodiment. The source region and the drain region include opposite dopant conductivities to form a TFET.

In block 232, a replacement metal gate process may be performed to replace a dummy gate with active gates. In block 234, source and drain contacts are formed in a patterned interlevel dielectric (ILD) layer. In block 236, gate contacts are formed in the ILD In block 238, processing continues.

Having described preferred embodiments 3D fin tunneling field effect transistor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A method for forming a tunneling field effect transistor, comprising:
    forming gate structures over a semiconductor fin on a substrate, the gate structures having at least a first, smaller pitch between the gate structures and a second, larger pitch between the gate structures, the first, smaller pitch being over a first region of the semiconductor fin and the second, larger pitch being over a second region of the semiconductor fin;
    recessing the first region and the second region of the semiconductor fin between the gate structures;
    depositing a first dielectric layer over the semiconductor fin to fill in a first gap between the gate structures over the first region of the semiconductor fin;
    filling a second gap between the gate structures over the second region of the semiconductor fin with a second dielectric layer;
    opening the first gap by etching the first dielectric layer to expose the recessed first region of the semiconductor fin while the second dielectric layer protects from opening the second gap;
    forming a source region on the exposed recessed first region of the semiconductor fin in the first gap;
    forming a dielectric fill on the source region in the first gap;
    opening the second gap by etching the second dielectric layer and the first dielectric layer to expose the recessed second region of the semiconductor fin; and
    forming a drain region on the exposed recessed second region of the semiconductor fin in the second gap.

2. The method as recited in claim 1, wherein forming the source region on the exposed recessed first region of the semiconductor fin in the first gap includes:
    depositing a dopant donor layer on the exposed recessed first region of the semiconductor fin in the first gap; and
    driving in dopants with an anneal process.

3. The method as recited in claim 2, further comprising:
    after opening the second gap and before forming the drain region, oxidizing the dopant donor layer; and stripping off the dopant donor layer.

4. The method as recited in claim 1, wherein forming the source region on the exposed recessed first region of the semiconductor fin in the first gap includes:
   epitaxially growing a dopant donor layer selectively on the exposed recessed first region of the semiconductor fin in the first gap; and
   driving in dopants with an anneal process.

5. The method as recited in claim 1, wherein depositing the first dielectric layer over the semiconductor fin to fill in the first gap includes employing pinch off during the depositing to fill in the first gap while the second gap remains unfilled due to its larger dimension.

6. The method as recited in claim 1, wherein forming the drain region on the exposed recessed second region of the semiconductor fin in the second gap includes:
   depositing a dopant donor layer on the exposed recessed second region of the semiconductor fin in the second gap; and
   driving in dopants with an anneal process.

7. The method as recited in claim 1, wherein forming the drain region on the exposed recessed second region of the semiconductor fin in the second gap includes:
   epitaxially growing a dopant donor layer selectively on the exposed recessed second region of the semiconductor fin in the second gap; and
   driving in dopants with an anneal process.

8. The method as recited in claim 1, wherein the source region and the drain region include opposite dopant conductivities.

9. The method as recited in claim 1, wherein recessing the semiconductor fin between the gate structures enables the source region and the drain region to occupy an entire width and height of a cross-section of each of the first region and the second region of the semiconductor fin to increase a width of a channel formed longitudinally along the semiconductor fin beneath the gate structures.

10. A method for forming a tunneling field effect transistor, comprising:
    forming gate structures over a semiconductor fin on a substrate, the gate structures having a first, smaller pitch between the gate structures and a second, larger pitch between the gate structures, the first, smaller pitch being over a first region of the semiconductor fin and the second, larger pitch being over a second region of the semiconductor fin;
    recessing the first region and the second region of the semiconductor fin between the gate structures;
    depositing a first dielectric layer over the semiconductor fin to fill in a first gap between the gate structures over the first region of the semiconductor fin by employing pinch off to fill in the first gap while a second gap between the gate structures over the second region of the semiconductor fin remains unfilled due to its larger dimension;
    filling the second gap between the gate structures over the second region of the semiconductor fin with a second dielectric layer;
    opening the first gap by etching the first dielectric layer to expose the recessed first region of the semiconductor fin while the second dielectric layer protects from opening the second gap;
    forming a source region on the exposed recessed first region of the semiconductor fin in the first gap and along exposed vertical surfaces of the semiconductor fin facing into the first gap;
    forming a dielectric fill on the source region in the first gap;
    opening the second gap by etching the second dielectric layer and the first dielectric layer to expose the recessed second region of the semiconductor fin; and
    forming a drain region on the exposed recessed second region of the semiconductor fin in the second gap and along exposed vertical surfaces of the semiconductor fin facing into the second gap wherein the source region and the drain region include opposite dopant conductivities and the source region and the drain region occupy an entire width and height of a cross-section of each of the first region and the second region of the semiconductor fin to increase a width of a channel formed longitudinally along the semiconductor fin beneath the gate structures.

11. The method as recited in claim 10, wherein forming the source region on the exposed recessed first region of the semiconductor fin in the first gap includes:
    depositing a dopant donor layer on the exposed recessed first region of the semiconductor fin in the first gap; and
    driving in dopants with an anneal process.

12. The method as recited in claim 11, further comprising:
    after opening the second gap and before forming the drain region, oxidizing the dopant donor layer; and
    stripping off the dopant donor layer.

13. The method as recited in claim 10, wherein forming the source region on the exposed recessed first region of the semiconductor fin in the first gap includes:
    epitaxially growing a dopant donor layer selectively on the exposed recessed first region of the semiconductor fin in the first gap; and
    driving in dopants with an anneal process.

14. The method as recited in claim 10, wherein forming the drain region on the exposed recessed second region of the semiconductor fin in the second gap includes:
    depositing a dopant donor layer on the exposed recessed second region of the semiconductor fin in the second gap; and
    driving in dopants with an anneal process.

15. The method as recited in claim 10, wherein forming the drain region on the exposed recessed second region of the semiconductor fin in the second gap includes:
    epitaxially growing a dopant donor layer selectively on the exposed recessed second region of the semiconductor fin in the second gap; and
    driving in dopants with an anneal process.

* * * * *